United States Patent
Iwata et al.

(10) Patent No.: US 8,431,035 B2
(45) Date of Patent: Apr. 30, 2013

(54) PLASMA PROCESSING APPARATUS AND METHOD

(75) Inventors: Manabu Iwata, Nirasaki (JP); Chishio Koshimizu, Nirasaki (JP); Yohei Yamazawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 110 days.

(21) Appl. No.: 12/465,436

(22) Filed: May 13, 2009

(65) Prior Publication Data

US 2009/0223933 A1 Sep. 10, 2009

Related U.S. Application Data

(62) Division of application No. 11/192,041, filed on Jul. 29, 2005, now abandoned.

(60) Provisional application No. 60/637,443, filed on Dec. 21, 2004.

(30) Foreign Application Priority Data

Jul. 30, 2004 (JP) ................................ 2004-223086

(51) Int. Cl.
| | |
|---|---|
| H01L 21/3065 | (2006.01) |
| C23C 16/00 | (2006.01) |
| C23C 16/50 | (2006.01) |
| C23C 16/503 | (2006.01) |
| C23C 16/52 | (2006.01) |
| B44C 1/22 | (2006.01) |

(52) U.S. Cl.
USPC ..... 216/71; 216/67; 156/345.28; 156/345.43; 156/345.44; 156/345.47; 118/723 R; 118/723 E

(58) Field of Classification Search ............. 156/345.28, 156/345.43, 345.44, 345.47; 118/723 R, 118/723 E; 216/67, 71
See application file for complete search history.

(56) References Cited

U.S. PATENT DOCUMENTS

| | | | |
|---|---|---|---|
| 4,131,533 | A | 12/1978 | Bialko et al. |
| 5,110,438 | A | 5/1992 | Ohmi et al. |

(Continued)

FOREIGN PATENT DOCUMENTS

| | | |
|---|---|---|
| JP | 61-119686 | 6/1986 |
| JP | 6-61185 | 3/1994 |

(Continued)

OTHER PUBLICATIONS

Office Action issued Sep. 14, 2010, in Japan Patent Application No. 2005-219984 (with English translation).

(Continued)

*Primary Examiner* — Jeffrie R Lund
(74) *Attorney, Agent, or Firm* — Rothwell, Figg, Ernst & Manbeck, P.C.

(57) ABSTRACT

A plasma processing apparatus for processing a substrate by using a plasma includes a processing chamber for accommodating and processing the substrate therein, a lower electrode for mounting the substrate thereon in the processing chamber, an upper electrode disposed to face the lower electrode in the processing chamber, a radio frequency power supply for supplying a radio frequency power to at least one of the lower and the upper electrode, to thereby generate the plasma between the lower and the upper electrode, and an electrical characteristic control unit for adjusting an impedance of a circuit at the side of an electrode to the plasma for a frequency of at least one radio frequency wave present in the processing chamber such that the circuit does not resonate.

5 Claims, 16 Drawing Sheets

U.S. PATENT DOCUMENTS

| | | | |
|---|---|---|---|
| 5,140,223 A | 8/1992 | Gesche et al. | |
| 6,042,686 A | 3/2000 | Dible et al. | |
| 6,265,831 B1 | 7/2001 | Howald et al. | |
| 6,462,482 B1 | 10/2002 | Wickramanayaka et al. | |
| 6,649,954 B2 | 11/2003 | Cross | |
| 7,415,940 B2 * | 8/2008 | Koshimizu et al. | 118/723 E |
| 7,537,672 B1 * | 5/2009 | Koshiishi et al. | 156/345.47 |
| 2003/0037881 A1 * | 2/2003 | Barnes et al. | 156/345.44 |
| 2004/0035365 A1 | 2/2004 | Yamazawa et al. | |
| 2004/0192056 A1 | 9/2004 | Iijima et al. | |
| 2006/0037704 A1 * | 2/2006 | Iwata et al. | 156/345.48 |
| 2009/0223933 A1 * | 9/2009 | Iwata et al. | 216/67 |
| 2009/0242516 A1 * | 10/2009 | Honda et al. | 216/71 |

FOREIGN PATENT DOCUMENTS

| | | |
|---|---|---|
| JP | 2000-323460 | 11/2000 |
| JP | 2002-43286 | 2/2002 |
| JP | 2004-193567 | 7/2004 |
| JP | 2005-500684 | 1/2005 |

OTHER PUBLICATIONS

Japanese Office Action issued Dec. 7, 2010, in Patent Application No. 2005-219984 (with English-language translation).

* cited by examiner

PLASMA PROCESSING APPARATUS AND METHOD

CROSS-REFERENCE TO RELATED APPLICATIONS

This application is a divisional Application of, and claims the benefit of priority under 35 U.S.C. §120 from, U.S. application Ser. No. 11/192,041, filed Jul. 29, 2005, herein incorporated by reference and U.S. Provisional Application Ser. No. 60/637,443, filed Dec. 21, 2004, which claims the benefit of priority under 35 U.S.C. §119 from Japanese Patent Application No. 2004-223086, filed on Jul. 30, 2004.

BACKGROUND OF THE INVENTION

1. Field of the Invention

The present invention relates to a plasma processing apparatus and method.

2. Description of the Related Art

In a manufacturing process of, for example, a semiconductor device or a liquid crystal display device, an etching process for etching a film on a substrate, a film forming process for forming an electrode or an insulating film on the substrate, or the like is performed. Widely employed for the etching or the film forming process is a plasma processing for processing the substrate by using a plasma.

The plasma processing is typically performed in a plasma processing apparatus. As such a plasma processing apparatus, a parallel plate type apparatus having an upper and a lower electrode disposed to face each other in parallel is widely utilized. In the parallel plate type plasma processing apparatus, for example, a plasma is generated in a processing space formed between the lower and the upper electrode by a radio frequency power supplied from a radio frequency power supply in a processing chamber, and a substrate loaded on the lower electrode is processed by the plasma.

Recently, however, in the plasma processing apparatus, the radio frequency power supply is designed to provide a radio frequency of a shorter wavelength to perform, for instance, a higher-density etching process or film forming process. If the radio frequency wave of the shorter wavelength is used, however, the plasma would be concentrated in a central portion of the processing space, resulting in a non-uniform plasma distribution in which the density of the plasma in the central portion of the processing space is higher than that in the peripheral portion thereof. As a result, the plasma processing in a central portion of a wafer progresses faster than that in its peripheral portion, so that final etching results are often found to be non-uniform over the surface of the substrate.

To solve the problem, there has been proposed a plasma processing apparatus having an upper electrode of a substantially convex shape in which its upper central portion protrudes from a peripheral portion thereof (see, e.g., Reference 1). Although, however, this apparatus has aimed at achieving a uniform plasma density in a processing chamber by allowing the plasma to diffuse uniformly throughout the processing chamber, this counterplan has not been effective enough to make an etching rate or a film forming speed be uniform over the whole surface of the substrate sufficiently.

(Reference 1) US Patent Publication No. 2004-0020431
Japanese Patent Laid-open Application No. 2003-297810

SUMMARY OF THE INVENTION

It is, therefore, an object of the present invention to provide a plasma processing apparatus and method capable of improving an in-surface uniformity in a plasma processing by reducing a discrepancy in the speed of the processing over the entire surface of a substrate.

To achieve the object, in accordance with a first aspect of the present invention, there is provided a plasma processing apparatus for processing a substrate by using a plasma, including a processing chamber for accommodating and processing the substrate therein; a lower electrode for mounting the substrate thereon in the processing chamber; an upper electrode disposed to face the lower electrode in the processing chamber; a radio frequency power supply for supplying a radio frequency power to at least one of the lower and the upper electrode, to thereby generate the plasma between the lower and the upper electrode; and an electrical characteristic control unit for adjusting an impedance of a circuit at the side of an electrode to the plasma for a frequency of at least one radio frequency wave present in the processing chamber such that the circuit does not resonate.

In accordance with the present invention, the impedance of the circuit at the side of the electrode can be adjusted to prevent the circuit from resonating. According to the investigation of the inventors, it is possible to reduce a discrepancy in the speed of a plasma processing over the surface of the substrate in the processing chamber. Thus, the plasma processing can be performed at a uniform speed over the surface of the substrate, thereby improving an in-surface uniformity in the plasma processing.

The electrical characteristic control unit may adjust an impedance of a circuit at the side of a facing electrode which faces a power supply electrode to which the radio frequency power is supplied. Further, in the present invention, in case that radio frequency powers are supplied to both of the upper and the lower electrode, the upper electrode is a facing electrode if the lower electrode is considered as a power supply electrode, whereas the lower electrode is a facing electrode if the upper electrode is considered as a power supply electrode.

The electrical characteristic control unit may have a variable element for varying the impedance. The electrical characteristic control unit may have a controller for controlling the impedance by adjusting the variable element.

The electrical characteristic control unit may have an impedance detector for detecting the impedance. In this case, the controller may control the impedance by adjusting the variable element based on a detection result from the impedance detector.

The electrical characteristic control unit may have an electrical characteristic control mechanism connected to the side of an electrode where the impedance is adjusted, and may adjust a reactance of a circuit at the side of the electrical characteristic control mechanism from an electrode surface facing the plasma to have a negative value.

The electrical characteristic control unit may adjust the impedance to deviate by a magnitude within $10\Omega$ from a resonance point.

Further, the electrical characteristic control unit may adjust the reactance to have a negative value of $-50\Omega$ or below. In this case, since the impedance of the circuit at the side of the electrode is set to deviate greatly from the resonance point, the electrical characteristic at the side of the electrode can be stabilized, and any discrepancy in performances among plasma processing apparatuses, which is caused by the electrical characteristic, can be reduced.

The upper electrode may be divided into a plurality of electrode portions, and the electrical characteristic control unit may be installed in at least one of the plurality of electrode portions.

The plasma processing apparatus may also include a DC power supply for applying a DC voltage to the electrode.

The electrode may be the upper electrode.

In accordance with a second aspect of the present invention, there is provided a plasma processing apparatus for processing a substrate by using a plasma, including a processing chamber for accommodating and processing the substrate therein; a lower electrode for mounting the substrate thereon in the processing chamber; an upper electrode disposed to face the lower electrode in the processing chamber; a radio frequency power supply for supplying a radio frequency power to at least one of the lower and the upper electrode, to thereby generate the plasma in a processing space between the lower and the upper electrode; and an electrical characteristic control unit for adjusting an electrical characteristic of a circuit at the side of an electrode to the plasma such that a value of current flowing into the electrode from the processing space does not reach a maximum current value.

In accordance with the present invention, the electrical characteristic of the circuit at the side of the electrode can be adjusted such that a value of current flowing into the electrode does not reach a maximum current value. According to the investigation of the inventors, it is possible to reduce a discrepancy in the speed of a plasma processing over the surface of the substrate in the processing chamber. Thus, the plasma processing can be performed at a uniform speed over the surface of the substrate, thereby improving an in-surface uniformity in the plasma processing.

The electrical characteristic control unit may adjust an electrical characteristic of a circuit at the side of a facing electrode which faces a power supply electrode to which the radio frequency power is supplied.

The electrical characteristic control unit may have a variable element for varying the current value. Further, the electrical characteristic control unit may have a controller for controlling the current value by adjusting the variable element.

The electrical characteristic control unit may have a current value detector for detecting the current value. In this case, the controller may control the current value by adjusting the variable element based on a detection result from the current value detector.

The electrical characteristic control unit may adjust the electrical characteristic such that the current value is not smaller than ½ of the maximum current value.

The upper electrode may be divided into a plurality of electrode portions, and the electrical characteristic control unit may be installed in at least one of the plurality of electrode portions.

The plasma processing apparatus may also include a DC power supply for applying a DC voltage to at least one of the lower and the upper electrode. Further, the DC voltage may be applied to the upper electrode.

In accordance with a third aspect of the present invention, there is provided a plasma processing method, including the steps of mounting a substrate on a lower electrode disposed to face an upper electrode in a processing chamber; supplying a radio frequency power to at least one of the lower and the upper electrode to thereby generate a plasma therebetween; and processing the substrate by using the plasma, wherein an impedance of a circuit at the side of an electrode to the plasma for a frequency of at least one radio frequency wave present in the processing chamber is adjusted such that the circuit does not resonate.

In accordance with the present invention, the impedance of the circuit at the side of the electrode can be adjusted to prevent the circuit from resonating. Accordingly, it is possible to reduce a discrepancy in the speed of a plasma processing over the surface of the substrate in the processing chamber. Thus, the plasma processing can be performed at a uniform speed over the surface of the substrate, thereby improving an in-surface uniformity in the plasma processing.

In the plasma processing method, an impedance of a circuit at the side of a facing electrode which faces a power supply electrode, to which the radio frequency power is supplied, may be adjusted such that the circuit does not resonate.

In the plasma processing method, the impedance may be adjusted to deviate by a magnitude within 10Ω from a resonance point.

A DC voltage may be applied to the electrode.

The electrode may be the upper electrode.

In accordance with a fourth aspect of the present invention, there is provided a plasma processing method, including the steps of mounting a substrate on a lower electrode disposed to face an upper electrode in a processing chamber; supplying a radio frequency power to at least one of the lower and the upper electrode to thereby generate a plasma in a processing space therebetween; and processing the substrate by using the plasma, wherein an electrical characteristic of a circuit at the side of an electrode to the plasma is adjusted such that a value of current flowing into the electrode from the processing space does not reach a maximum current value.

In accordance with the present invention, the electrical characteristic of the circuit at the side of the electrode can be adjusted such that a value of current flowing into the electrode does not reach a maximum current value. Accordingly, it is possible to reduce a discrepancy in the speed of a plasma processing over the surface of the substrate in the processing chamber. Thus, the plasma processing can be performed at a uniform speed over the surface of the substrate, thereby improving an in-surface uniformity in the plasma processing.

In the plasma processing method, an electrical characteristic of a circuit at the side of a facing electrode which faces a power supply electrode, to which the radio frequency power is supplied, may be adjusted such that a value of current flowing into the facing electrode does not reach a maximum current value.

In the plasma processing method, the electrical characteristic may be adjusted such that the current value is not smaller than ½ of the maximum current value.

In the plasma processing method, a DC voltage may be applied to at least one of the lower and the upper electrode. Further, the DC voltage may be applied to the upper electrode.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
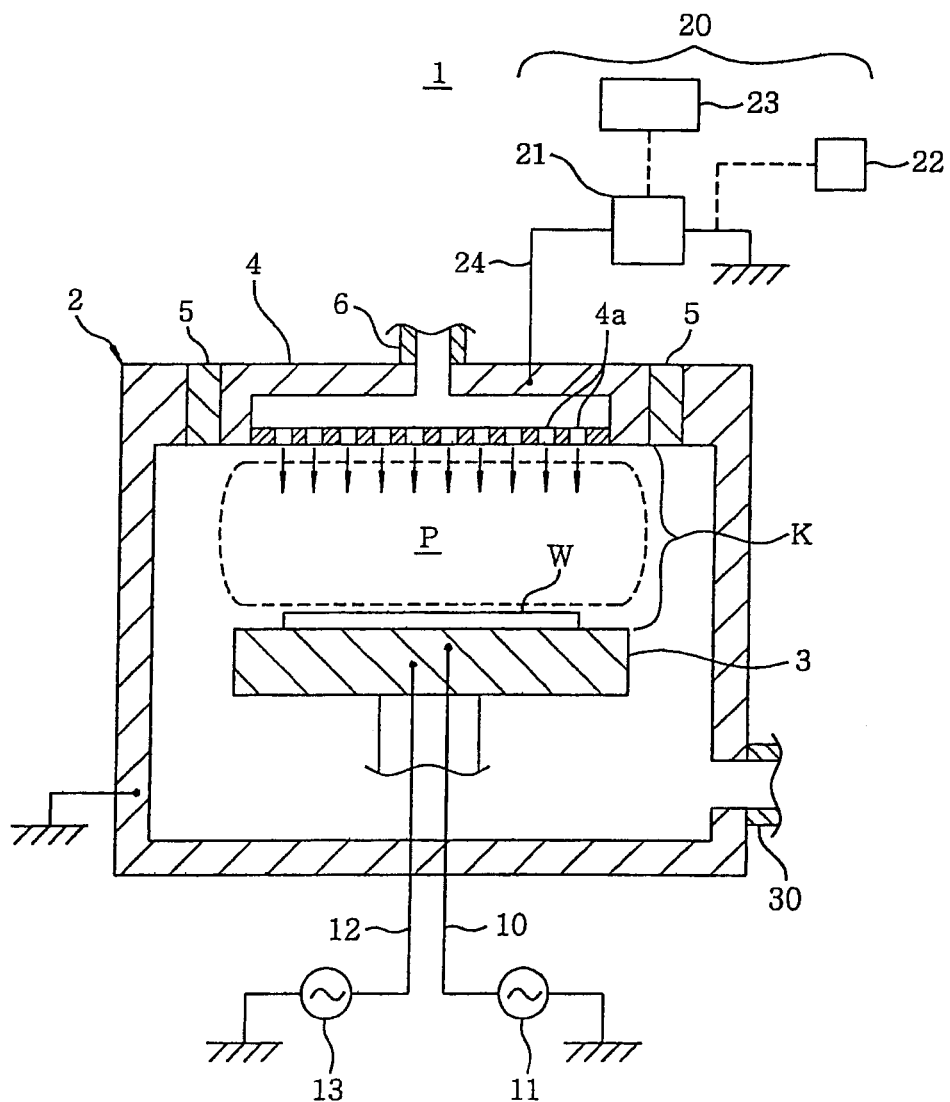
FIG. 1 provides a longitudinal cross sectional view to illustrate a schematic configuration of a plasma etching apparatus in accordance with a preferred embodiment of the present invention.

Hereinafter, preferred embodiments of the present invention will be described with reference to the accompanying drawings. FIG. 1 provides a longitudinal cross sectional view to illustrate a schematic configuration of a plasma etching apparatus 1 as an example of a plasma processing apparatus in accordance with the present invention. Further, parts having substantially same functions and configurations will be designated with same reference numerals in the specification and the drawings, and redundant explanations thereof will be omitted.

As shown in FIG. 1, the plasma etching apparatus 1 includes, for example, a substantially cylindrical processing chamber 2 having a top capable of being opened and a base. The processing chamber 2 is grounded. A lower electrode 3 also serving as a mounting table for mounting a wafer W thereon is installed at a central portion of the processing chamber 2. The lower electrode 3 is vertically movable by an elevating mechanism (not shown). Further, the lower electrode 3 can be maintained at a preset temperature by a heater buried therein and/or a temperature controlling mechanism (not shown) including a temperature measuring device and the like.

An upper electrode 4 of, for example, a substantially disc shape is disposed at a processing chamber 2's ceiling portion which faces a mounting surface of the lower electrode 3. An annular insulator 5 is interposed between the upper electrode 4 and the processing chamber 2 such that the upper electrode 4 and the processing chamber 2 are electrically isolated from each other. The upper electrode 4 is provided with its lower surface with, for example, a number of gas injection openings 4a that communicate with a gas supply line 6 connected to an upper surface of the upper electrode 4. The gas supply line 6 is connected to a gas supply source (not shown) for supplying a processing gas for etching, e.g., HBr gas or $O_2$ gas. The processing gas introduced into the upper electrode 4 through the gas supply line 6 is supplied into the processing chamber 2 through the plurality of the gas injection openings 4a.

A first radio frequency power supply 11 for generating a plasma is connected to the lower electrode 3 via a conductive line 10. The first radio frequency power supply 11 is grounded and supplies a radio frequency power of, for example, 100 MHz, to the lower electrode 3 for plasma generation. By applying such a radio frequency power to the lower electrode 3 from the first radio frequency power supply 11, a radio frequency voltage is applied to a processing space K between the lower and the upper electrode 3 and 4, so that a plasma P of a processing gas can be generated in the processing space K. Furthermore, since the first radio frequency power supply 11 is connected to the lower electrode 3 in this preferred embodiment, the lower electrode 3 serves as a power supply electrode while the upper electrode 4 functions as a facing electrode.

Also, a second radio frequency power supply 13 is connected to the lower electrode 3 to attract ions thereto via a conductive line 12. The second radio frequency power supply 13 is grounded and supplies the lower electrode 3 with a radio frequency power of a frequency lower than that from the first radio frequency power supply 11. For instance, the second radio frequency power supply 13 supplies a radio frequency power of 13.56 MHz for ion attraction. By applying such a radio frequency power to the lower electrode 3 from the second radio frequency power supply 13, charged particles among the plasma P in the processing space K can be attracted toward the wafer W. Moreover, the plasma P can be further generated by the radio frequency power supplied from the second radio frequency power supply 13.

Figure 2:
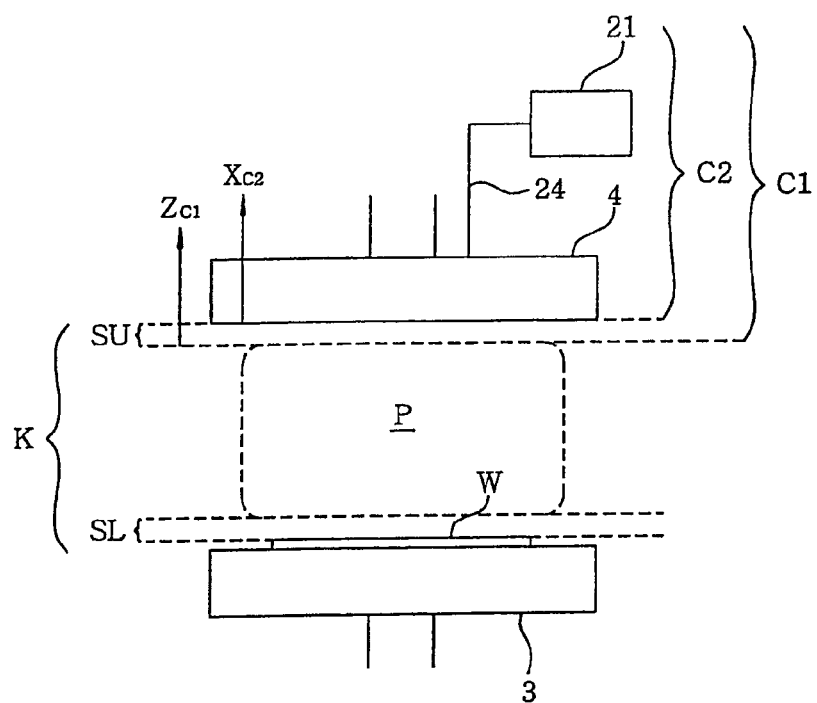
FIG. 2 sets forth a schematic view of the plasma etching apparatus to explain an impedance of a circuit at the side of an upper electrode to a plasma.

The plasma etching apparatus 1 has an electrical characteristic control unit 20 for adjusting an impedance $Z_{c1}$ of a circuit C1 at the side of the upper electrode 4 to the plasma P. As illustrated in FIG. 2, a vacuum sheath region SU is formed between the upper electrode 4 and an area in which the plasma P is formed in the processing space K. In the preferred embodiment of the present invention, the circuit C1 at the side of the upper electrode 4 to the plasma P includes the sheath region SU, the upper electrode 4, a conductive line 24 and an electrical characteristic control circuit 21 to be described later (i.e., the circuit C1 includes the whole region electrically connected to the upper electrode 4 plus the sheath region SU). Further, the impedance $Z_{c1}$ is an impedance of the circuit C1 and, for example, it is an impedance for the radio frequency of the first radio frequency power supply 11 for plasma generation. In case a radio frequency power supply is connected to the upper electrode 4, the circuit C1 also includes the radio frequency power supply.

Figure 3:
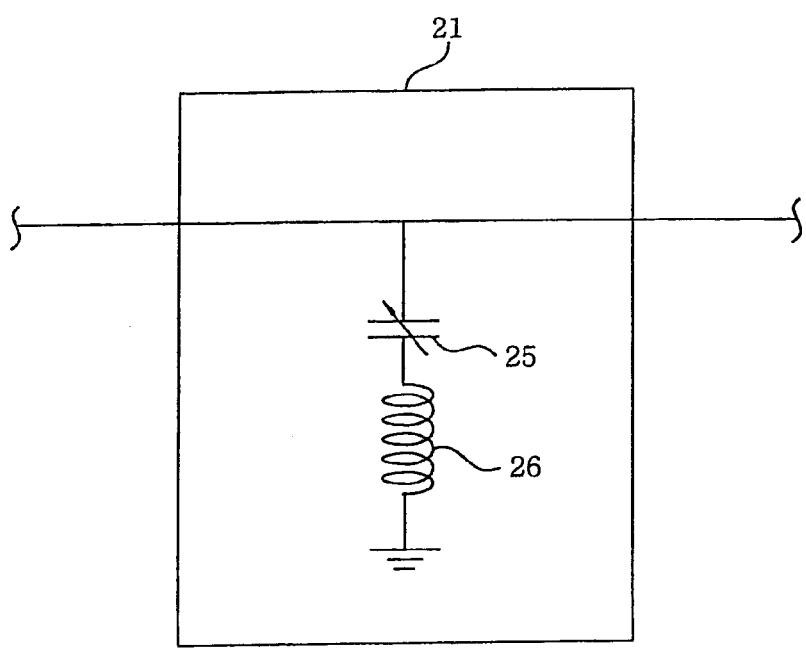
FIG. 3 presents a schematic view to illustrate a configuration of an electrical characteristic control unit.

As illustrated in FIG. 1, the electrical characteristic control unit 20 includes, for example, the electrical characteristic control circuit 21, an impedance detector 22 and a controller 23. The electrical characteristic control circuit 21 is connected to the upper electrode 4 via, e.g., the conductive line 24. Further, for example, as illustrated in FIG. 3, the electrical characteristic control circuit 21 has a variable condenser 25 serving as a variable element, a fixed coil 26 and the like. The impedance $Z_{c1}$ can be adjusted by changing a capacitance of the variable condenser 25.

The impedance detector 22 can be removably connected to, e.g., the electrical characteristic control circuit 21 or the conductive line 24, and it serves to detect, e.g., the impedance $Z_{c1}$ at the side of the upper electrode 4 connected to the conductive line 24.

The controller 23 controls, e.g., the variable condenser 25 of the electrical characteristic control circuit 21 such that the impedance $Z_{c1}$ has a predetermined value.

A gas exhaust line 30 connected with a gas exhausting mechanism (not shown) is coupled to a lower portion of the processing chamber 2. By vacuum evacuating the processing chamber 2 via the gas exhaust line 30, the internal pressure of the processing chamber 2 can be maintained at a preset level. Further, a magnet can be disposed outside the wall of the processing chamber 2 to provide a magnetic field in the processing chamber 2. In such a case, the magnet is preferably configured to provide a magnetic field whose intensity is variable.

Hereinafter, an etching process performed by using the plasma etching apparatus 1 configured as described above will be explained. For example, prior to starting the etching, the impedance detector 22 is connected to, e.g., the conductive line 24 in the plasma etching apparatus 1. The impedance detector 22 detects an impedance $Z_{C1}$ for, e.g., each of capacitance values of the variable condenser 25 in the electrical characteristic control circuit 21. Accordingly, a correlation between the capacitance values (control values) of the variable condenser 25 of the electrical characteristic control circuit 21 and the impedance values $Z_{C1}$ can be investigated. Based on the correlation, a control value of the variable condenser 25 is set in the controller 23 such that the circuit C1 does not produce resonance (series resonance). For instance, the control value is set such that the impedance $Z_{C1}$ deviates by a magnitude within 10Ω from a resonance point. The controller 23 controls the variable condenser 25 based on the set control value so that the impedance $Z_{C1}$ is adjusted to have a value at which the circuit C1 does not resonate.

Thereafter, as shown in FIG. 1, a wafer W is loaded into the processing chamber 2 and is mounted on the lower electrode 3. Then, the processing chamber 2 is evacuated via the gas exhaust line 30 and, at the same time, a predetermined processing gas is supplied into the processing chamber 2 through the gas injection openings 4a. At this time, the processing chamber 2 is depressurized to a preset level and is maintained thereat.

Subsequently, a radio frequency power of, e.g., 100 MHz for generating plasma and a radio frequency power of, e.g., 13.56 MHz for attracting ions are supplied to the lower electrode 3 from the first and the second radio frequency power supply 11 and 13, respectively, such that the radio frequency voltages are applied to the processing space K. By the radio frequency voltages, the processing gas in the processing space K is converted into a plasma P. Charged particles in the plasma P are attracted toward the wafer W, thus etching the surface of the wafer W. After the etching is performed for a predetermined time period, the supply of the radio frequency powers and the processing gas is stopped and the wafer W is unloaded from the processing chamber 2. Then, the etching process is completed.

Here, a relationship between an adjusted value of the impedance $Z_{C1}$ and an etching result of the above-described etching process is verified by investigating an experiment. As such an experiment, etching was performed by using the above-described plasma etching apparatus 1. Conditions for the etching were as follows: a flow rate of a processing gas HBr was set to be 90 cm$^3$/min; a processing pressure was set to be 0.4 Pa (3 mTorr); radio frequency powers of 100 MHz and 13.56 MHz were applied from the radio frequency power supplies of 500 W and 100 W, respectively.

Figure 4:
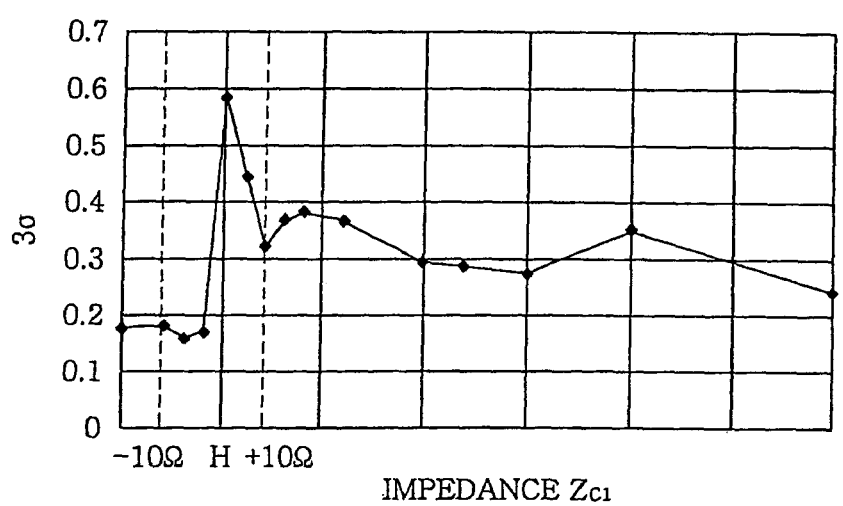
FIG. 4 exhibits a graph to explain a relationship between an impedance and an in-surface uniformity of etching.

FIG. 4 shows a relationship between the impedance $Z_{C1}$ and an in-surface uniformity (3σ) of an etching rate. In the figure, H represents a resonance point of the impedance $Z_{C1}$. As can be seen from FIG. 4, it is found that the in-surface uniformity of the etching rate deteriorates when the impedance $Z_{C1}$ is at the resonance point H while the in-surface uniformity improves when the impedance $Z_{C1}$ is set to deviate from the resonance point H. In particular, the in-surface uniformity is found to improve greatly when the impedance $Z_{C1}$ is set to deviate by a magnitude within 10Ω from the resonance point H.

Figure 5A:
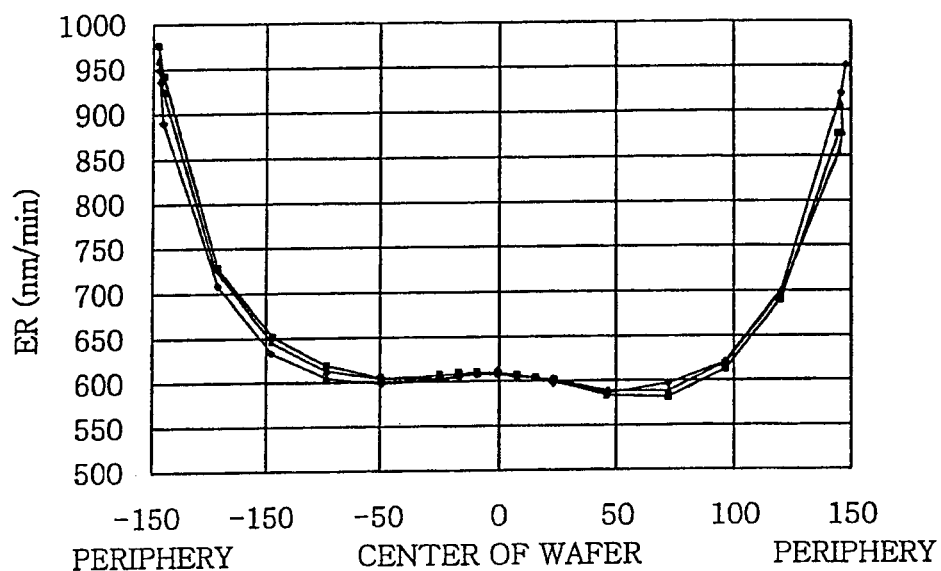
FIGS. 5A to 5C set forth graphs of showing an etching rate over a wafer surface by varying an impedance.
Figure 5B:
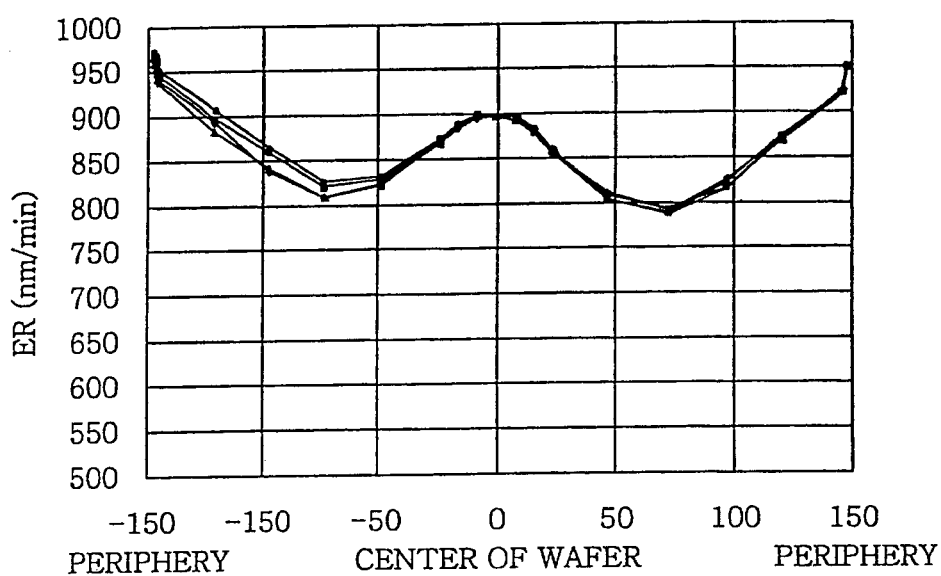
Figure 5C:
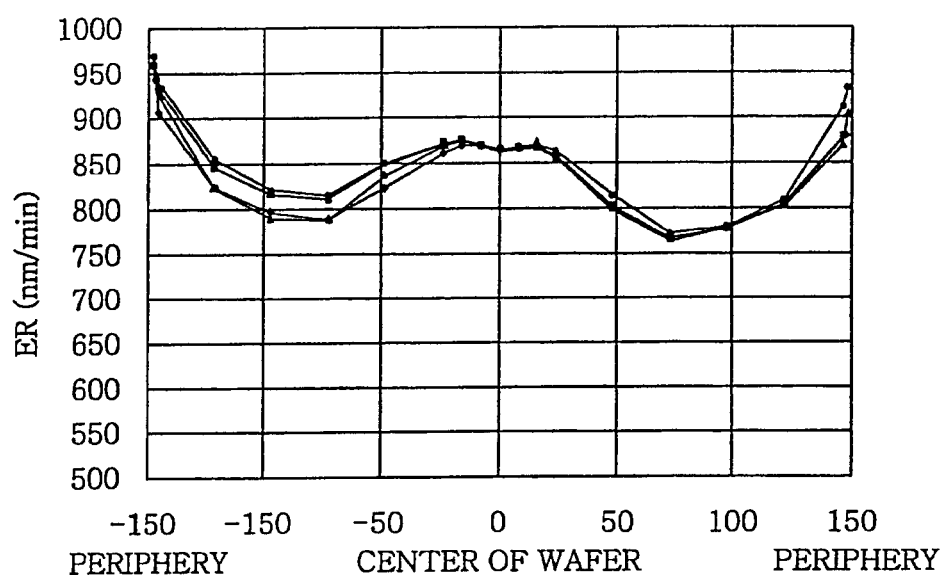

FIG. 5A presents a graph of showing an etching rate (ER) over a wafer surface when the impedance $Z_{C1}$ is at the resonance point. FIGS. 5B and 5C show graphs of showing the etching rate over the wafer surface when the impedance $Z_{C1}$ is set to deviate from the resonance point by +3Ω and +8Ω, respectively.

In FIGS. 5A to 5C, it is observed that the etching rate improves rapidly when the impedance $Z_{C1}$ is set to deviate from the resonance point. Further, the in-surface uniformity of the etching rate is also found to improve as well.

Figure 6A:
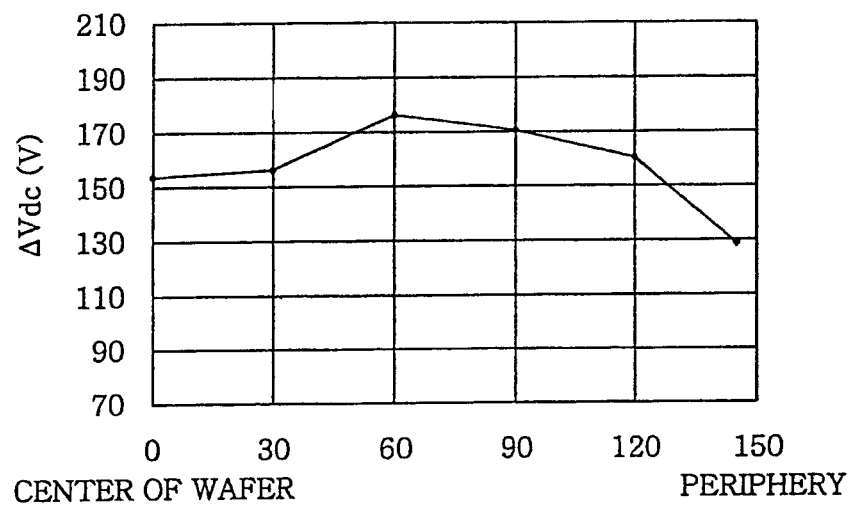
FIGS. 6A and 6B offer graphs to explain an in-surface uniformity in a potential difference in a sheath region by varying an impedance.
Figure 6B:
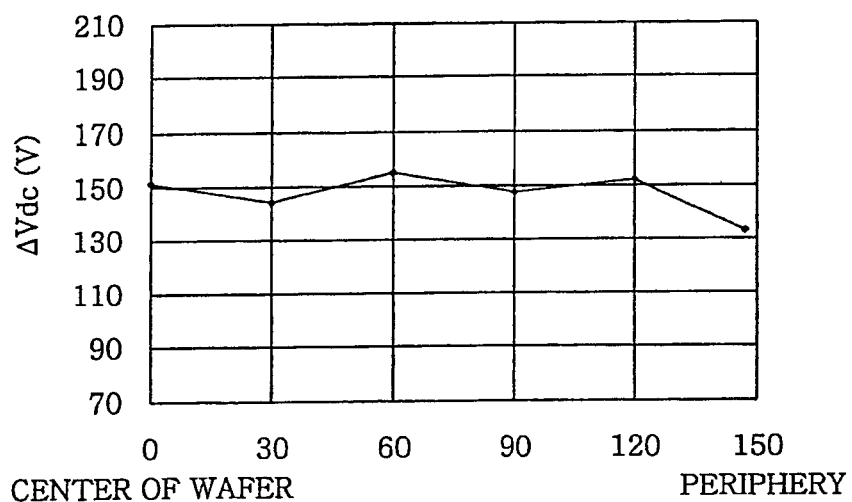

Further, FIG. 6A provides a graph of showing an in-surface uniformity (ΔVdc) in potential difference in a sheath region SL (shown in FIG. 2) when the circuit C1 is resonated. It is possible to estimate the amount of damage caused by the etching on the wafer surface based on the in-surface uniformity (ΔVdc) in the potential difference. FIG. 6B depicts a graph of showing an in-surface uniformity in the potential difference when the impedance $Z_{C1}$ is set to deviate from the resonance point by −4Ω.

As can be seen from FIGS. 6A and 6B, it is found that the in-surface uniformity in the potential difference in the sheath region SL improves when the impedance $Z_{C1}$ is set to deviate from the resonance point, resulting in reduction in the amount of damage caused by the etching.

In accordance with the preferred embodiment as described above, the impedance $Z_{C1}$ of the circuit C1 at the side of the upper electrode 4 to the plasma P is adjusted to prevent the circuit C1 from resonating by installing the electrical characteristic control unit 20 in the plasma etching apparatus 1. Thus, the uniformity of the etching rate can be improved over the whole surface of the wafer W. Particularly, by setting the impedance $Z_{C1}$ to deviate from the resonance point by a magnitude within 10Ω, the etching rate can be improved, thus reducing the damage that might be caused by the etching.

In the above-described preferred embodiment, the impedance $Z_{C1}$ can be changed relatively simply by adjusting the electrical characteristic of the upper electrode 4 by means of the variable condenser 25 of the electrical characteristic control unit 20.

Figure 7:
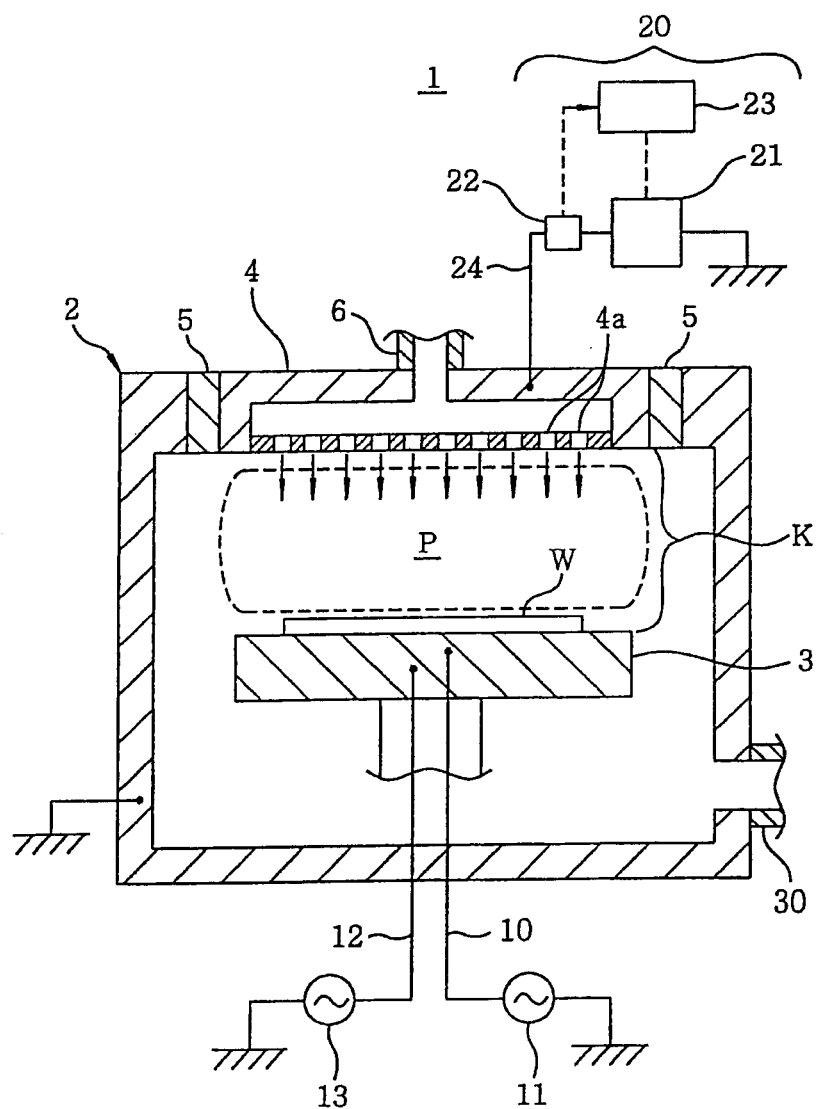
FIG. 7 shows a longitudinal cross sectional view to illustrate a schematic configuration of a plasma etching apparatus for automatically detecting an impedance.

Though the impedance detector 22 is connected to the conductive line 24 at the time of detecting the impedance $Z_{C1}$ in the above-described preferred embodiment, it is also possible to connect the impedance detector 22 to the conductive line 24 in advance, as shown in FIG. 7, such that the detection result of the impedance detector 22 is outputted to the controller 23. In such a case, for example, the controller 23 controls the variable condenser 25 of the electrical characteristic control circuit 21 based on the detection result from the impedance detector 22, to thereby adjust the impedance $Z_{C1}$ to be set at a predetermined value at which the circuit C1 does not resonate. By this mechanism, the impedance $Z_{C1}$ can be automatically adjusted. Moreover, during the etching process, the impedance detector 22 may detect the impedance $Z_{C1}$ on a real time basis and, in case the value of the impedance $Z_{C1}$ becomes close to the resonance point due to any reason, the controller 23 can change the control value of the variable condenser 25 to thereby modify the impedance $Z_{C1}$ to have a value at which the circuit C1 does not resonate. As a consequence, the resonance of the circuit C1 can be prevented more effectively and, thus, the in-surface uniformity of the etching can be improved stably.

When the impedance $Z_{C1}$ is adjusted to prevent the circuit C1 from resonating as described in the above embodiment, it is also possible to adjust a reactance $X_{C2}$ of a circuit C2 at the side of the electrical characteristic control circuit 21 to have a negative value at an electrode surface 4a of the upper electrode 4 that contacts the sheath region SU, as shown in FIG. 2. The circuit C2 includes the upper electrode 4, the conductive line 24 and the electrical characteristic control circuit 21, and the reactance $X_{C2}$ refers to a reactance of the circuit C2.

In general, an impedance Z of a circuit can be expressed as follows:

$$Z=R+iX \qquad \text{Eq. (1)}$$

(R is a resistance and X is a reactance).

Further, series resonance of a circuit is produced when the reactance X has a value of 0.

In the sheath region SU present between the plasma P and the upper electrode 4 in the plasma etching apparatus 1, capacitance, i.e., reactance, always has a negative value electrically. Therefore, by setting the reactance $X_{C2}$ of the circuit C2 at the side of the electrical characteristic circuit 21 to have a negative value at the electrode surface 4a, the reactance of the entire circuit C1 at the side of the electrode surface 4a to the plasma P can always be maintained negative, whereby the reactance of the circuit C1 is prevented from being zero. As a result, the impedance $Z_{C1}$ is adjusted such that the circuit C1 does not resonate. In this case, it is possible to prevent resonance in principle regardless of a state of the plasma in the processing space K. Here, an electrical characteristic control mechanism is used to maintain the reactance $X_{C2}$ of the circuit C2 negative all the time. The electrical characteristic control circuit 21 is preferred as such an electrical characteristic control mechanism. By setting an electrical characteristic (reactance) of the electrical characteristic control mechanism to have a desired value, the reactance $X_{C2}$ of the circuit C2 can always have a negative value. Here, the electrical characteristic control mechanism may have a variable element such as the variable condenser 25 of the electrical characteristic control circuit 21 or may have only a fixed element.

In this preferred embodiment, the reactance $X_{C2}$ can be set to have a negative valve equal to or smaller than, e.g., $-50\Omega$. In such a case, since the reactance of the circuit C1 can never be zero, the resonance of the circuit C1 can be certainly prevented, so that the operation of the plasma etching apparatus 1 can be stabilized. Consequently, any discrepancy in, e.g., operations among a plurality of plasma etching apparatuses can be reduced.

Though the preferred embodiment has been described for the plasma etching apparatus 1 in which two kinds of radio frequency powers are supplied to the lower electrode 3, it is also possible to supply the lower electrode 3 with only one kind of radio frequency power for plasma generation.

Further, though the radio frequency power is supplied to the lower electrode 3 in the preferred embodiment described above, it is also possible to supply the radio frequency power for plasma generation to the upper electrode 4 instead of the lower electrode 3. In such a case, the impedance of the circuit at the side of the lower electrode 3 to the plasma P can be adjusted for the frequency of the radio frequency power for plasma generation such that the circuit does not resonate. At this time, the electrical characteristic control circuit 21 is installed at the side of, e.g., the lower electrode 3 to be connected therewith.

Figure 8:
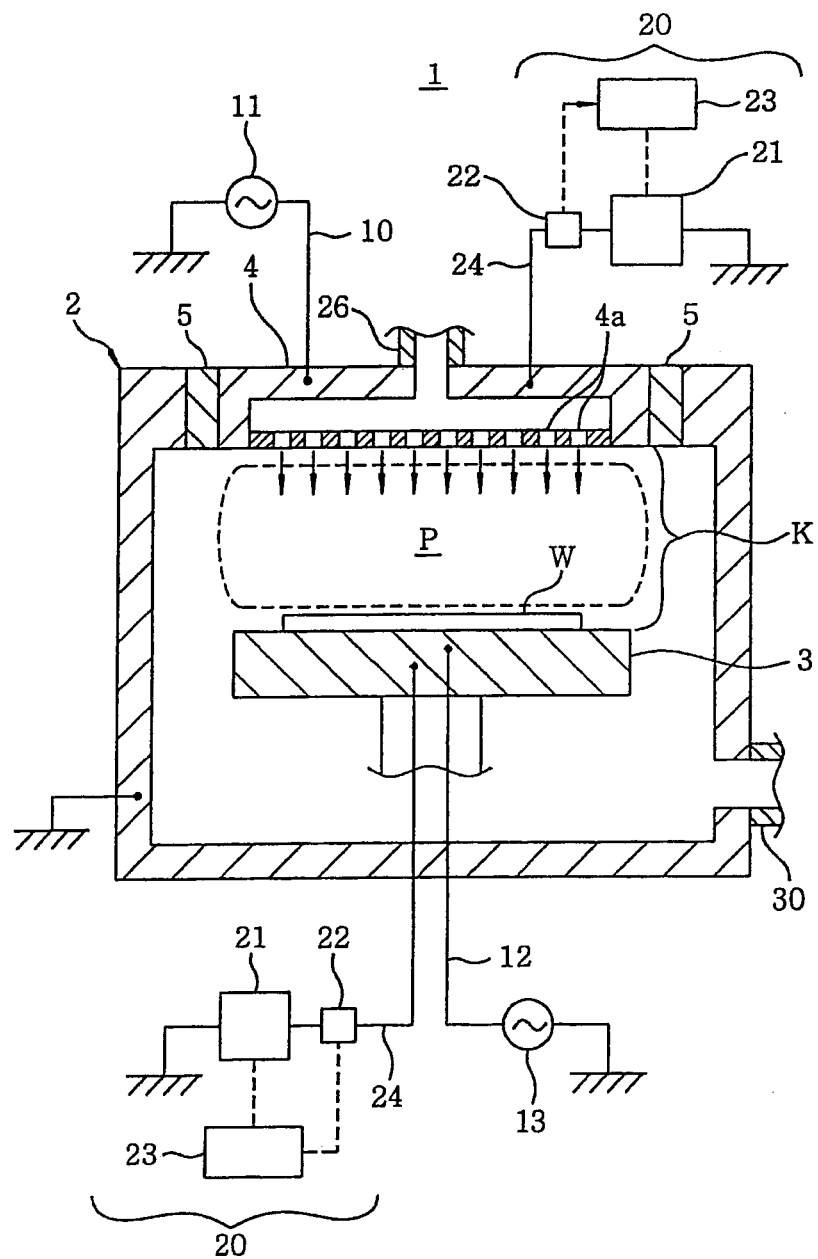
FIG. 8 depicts a longitudinal cross sectional view to describe a configuration of a plasma etching apparatus in which radio frequency power supplies are connected to an upper and a lower electrode, respectively.

Moreover, radio frequency powers may be supplied to both of the upper and the lower electrode 4 and 3 and adjust the impedance of each circuit at each of the sides of the two facing electrodes to the plasma P such that each circuit does not resonate. In this case, for example, electrical characteristic control circuits 21 are connected to both of the upper and the lower electrode 3, as shown in FIG. 8. The electrical characteristic control circuit 21 connected to the upper electrode 4 adjusts the impedance of the circuit at the side of the upper electrode 4 to the plasma P for the frequency of the radio frequency power supplied to the lower electrode 3. Meanwhile, the electrical characteristic control circuit 21 coupled to the lower electrode 3 adjusts the impedance of the circuit at the side of the lower electrode 3 to the plasma P for the frequency of the radio frequency power supplied to the upper electrode 4.

Figure 9:
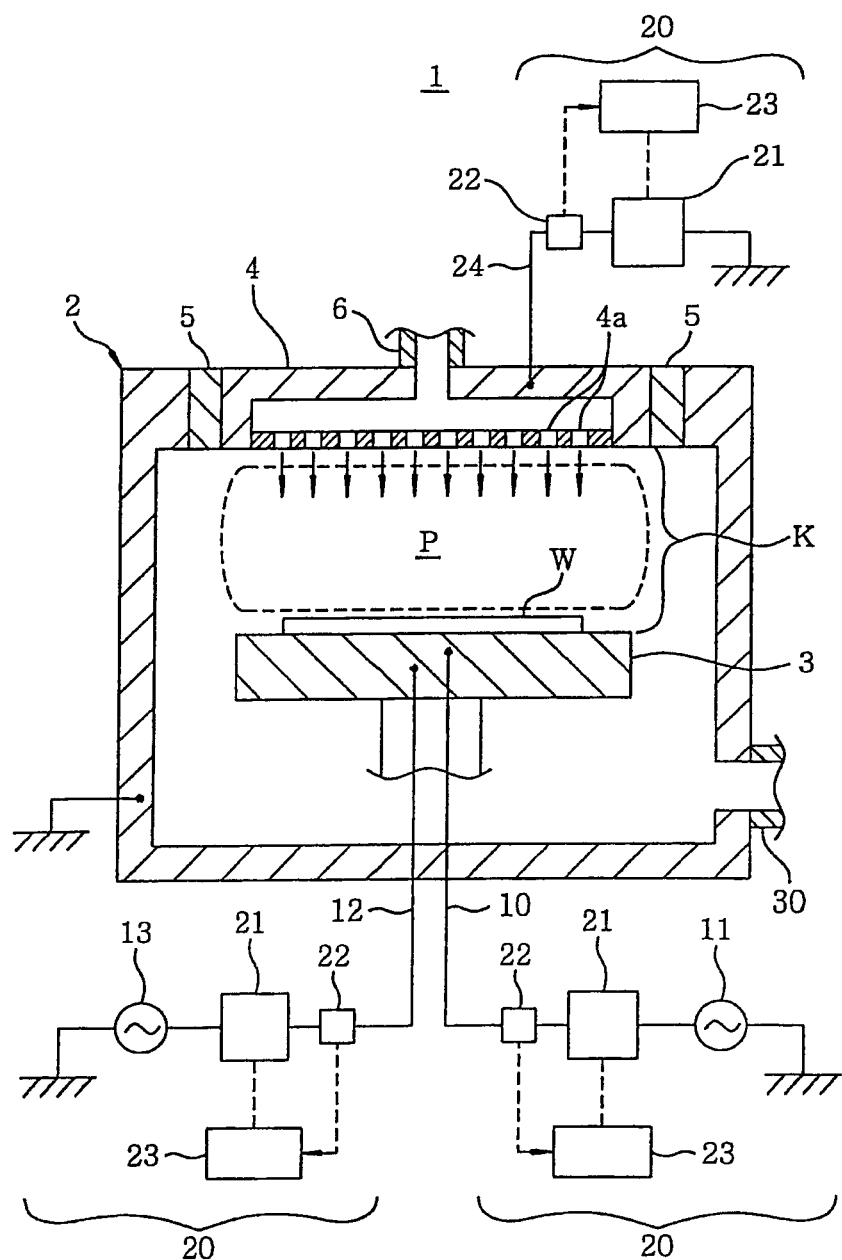
FIG. 9 provides a longitudinal cross sectional view to describe a configuration of a plasma etching apparatus in which an electrical characteristic control unit is installed at the side of a lower electrode.

In the preferred embodiment described above, for the frequency of the radio frequency power supplied to the power supply electrode, the impedance of the circuit at the other electrode at the side facing the power supply electrode is adjusted to prevent the circuit from resonating. But, it is also possible to adjust an impedance for a frequency of another radio frequency power transmitted to and present in the processing space K such that a circuit does not resonate. In this case, for example, the radio frequency wave includes a harmonic wave generated by supplying the radio frequency power. Further, an electrical characteristic control unit 20 identical to that of the above-described preferred embodiment is installed at the side of the lower electrode 3 to which radio frequency power supplies 11 and 13 are connected, as shown in FIG. 9. For example, an electrical characteristic control circuit 21 and an impedance detector 22 are connected to each of the conductive lines 10 and 12 which connect the radio frequency powers 11 and 13 to the lower electrode 3, respectively.

Figure 10:
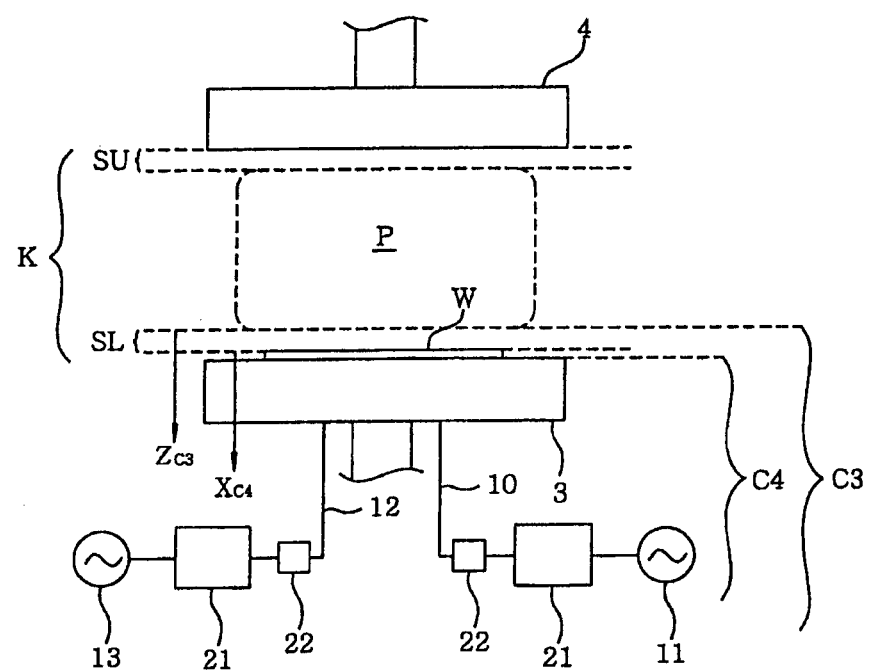
FIG. 10 presents a longitudinal cross sectional view of a plasma etching apparatus to describe an impedance of a circuit at the side of a lower electrode to a plasma.

Further, an impedance $Z_{c3}$ of a circuit C3 at the side of the lower electrode 3 to the plasma P is adjusted by, e.g., the electrical characteristic control unit 20 such that the circuit C3 does not resonate for the harmonic wave present in the processing space K. As shown in FIG. 10, the circuit C3 at the side of the lower electrode 3 to the plasma P includes the sheath region SL, the lower electrode 3, the conductive lines 10 and 12, the radio frequency power supplies 11 and 13, the impedance detector 22 and the electrical characteristic control circuit 21. The impedance $Z_{c3}$ is an impedance of the circuit C3 for, e.g., the harmonic wave generated in the processing space K. Further, in FIG. 10, a circuit C4 includes the lower electrode 3, the conductive lines 10 and 12, the radio frequency power supplies 11 and 13, the impedance detector 22 and the electrical characteristic control circuit 21. A reactance $X_{c4}$ is a reactance in the circuit C4.

More specifically, for example, by using the electrical characteristic control unit 20, the reactance $X_{c4}$ of the circuit C4 is set to have a value of $-50\Omega$ or smaller such that the impedance $Z_{c3}$ deviates from the resonance point greatly, thus preventing the circuit C3 from resonating. By doing this, the circuit C3 can be prevented from resonating for a harmonic wave at the side of the radio frequency power supply in any of plasma processing apparatuses having different processing states and conditions, and the plasma processing can be performed stably in all of the plasma etching apparatuses 1. As a result, any discrepancy in plasma processing of various plasma processing apparatuses can be reduced.

Figure 11:
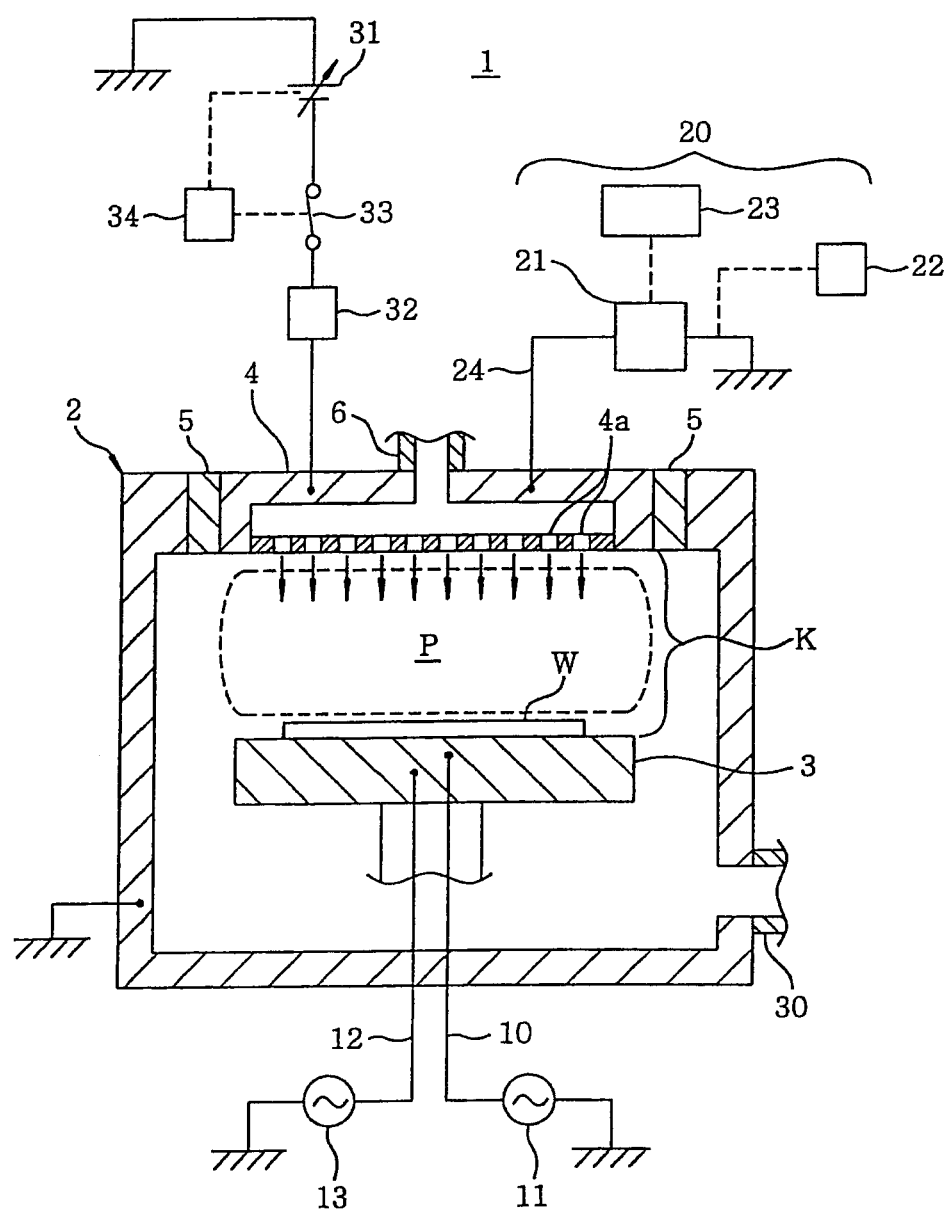
FIG. 11 depicts a longitudinal cross sectional view to illustrate a configuration of a plasma etching apparatus in which a DC power supply is connected to an upper electrode.

Further, in the above-described preferred embodiment, it is possible to connect a DC power supply to the upper electrode 4, as illustrated in FIG. 11. In FIG. 11, a variable DC power supply 31 is electrically connected to the upper electrode 4 via a low pass filter 32. Here, the variable DC power supply 31 may be a bipolar power supply. The variable DC power supply 31 can be turned on or off by a relay switch 33. A DC voltage controller 34 controls the polarity, the current value and the voltage value of the variable DC power supply 31 and the on/off operation of the relay switch 33. The low pass filter 32 for trapping a radio frequency from the first or the second radio frequency power supply 11 or 13 is formed of, preferably, an LR filter or a CL filter.

Further, a DC voltage of predetermined polarity and magnitude is applied to the upper electrode 4 from the variable DC power supply 31. By doing this, deposits stuck on the surface of the upper electrode 4 are sputtered, thereby cleaning the surface of the upper electrode 4. In addition, since the plasma P generated in the processing chamber 2 is diminished, an effective residence time of the plasma on the wafer W is reduced, thus effectively reducing the etching of an organic mask such as a photoresist film due to a dissociation of a fluorocarbon based processing gas. Moreover, since electrons generated in the vicinity of the upper electrode 4 are irradiated onto the wafer W, the mask composition on the wafer W can be improved and the roughness of the photoresist film can be ameliorated.

Furthermore, by coupling the upper electrode 4 with the electrical characteristic control unit 20 of the plasma etching apparatus 1 described in the above preferred embodiment as well as the DC power supply, there can be obtained both the effect of applying a DC voltage to the upper electrode 4 and the effect of improving an etching rate over the whole surface of the wafer W by adjusting the impedance $Z_{C1}$ of the circuit C1 at the side of the upper electrode 4 to the plasma P such that the circuit C1 does not resonate by means of the electrical characteristic control unit 20.

If a DC voltage of minus polarity and magnitude greater than a self-bias voltage VDC generated on a surface of the upper electrode 4 is applied to the upper electrode 4, the sheath region SU between the area in which the plasma P is formed and the upper electrode 4 shown in FIG. 2 gets thickened. As a result of the expansion of the sheath region SU, the impedance $Z_{C1}$ of the circuit C1 at the side of the upper electrode 4 to the plasma P may be changed (reduced). However, by adjusting the changed impedance $Z_{c1}$ such that the circuit C1 will not resonate, an etching rate over the entire surface of the wafer W can be improved.

Figure 12:
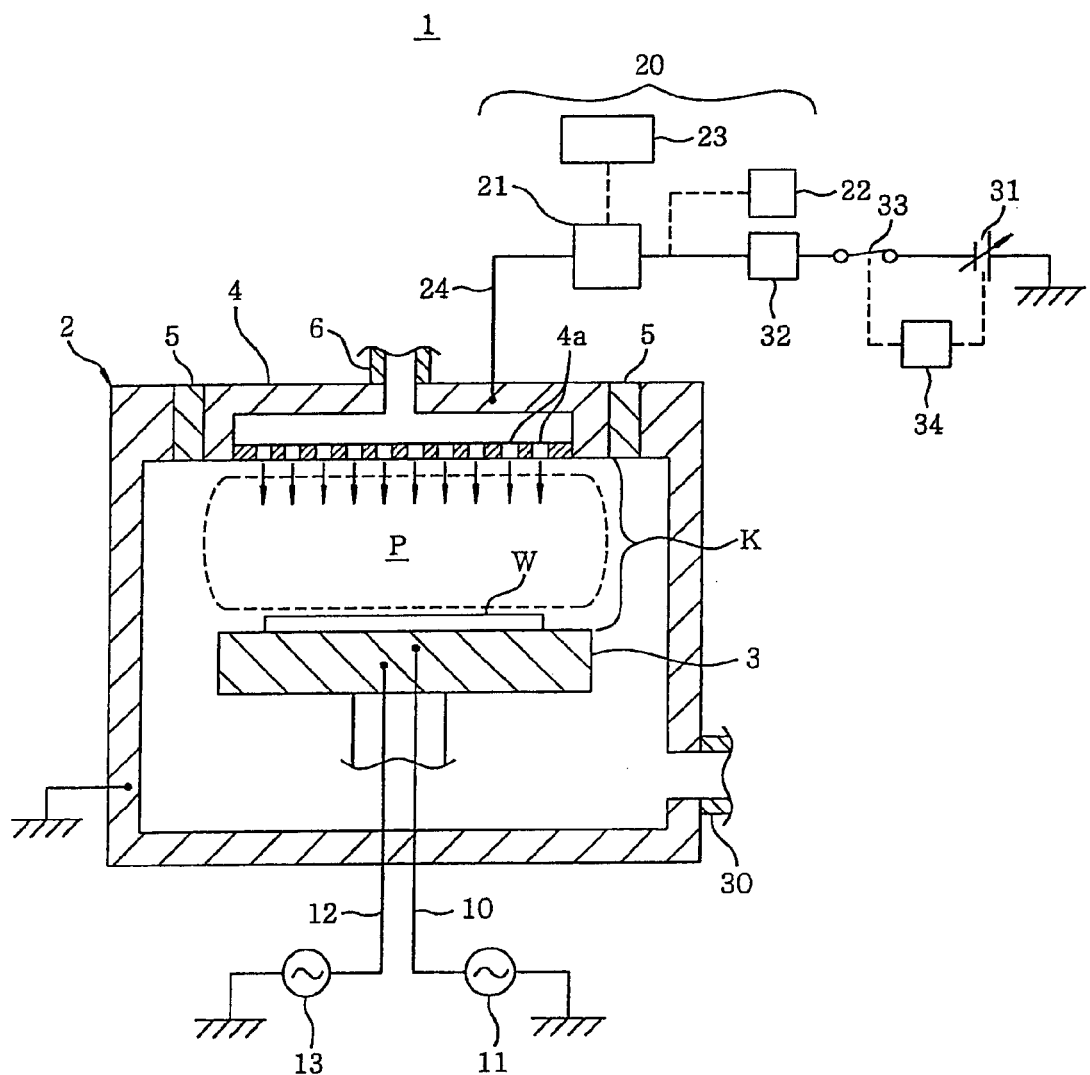
FIG. 12 presents a longitudinal cross sectional view to illustrate a configuration of a plasma etching apparatus in which a DC power supply is installed on the GND side of an electrical characteristic control circuit.

Moreover, as illustrated in FIG. 12, the variable DC power supply 31, the low pass filter 32 and the relay switch 33 can be provided on the GND side of the electrical characteristic control circuit 21 to achieve the same effect as that obtained in FIG. 11.

Figure 13:
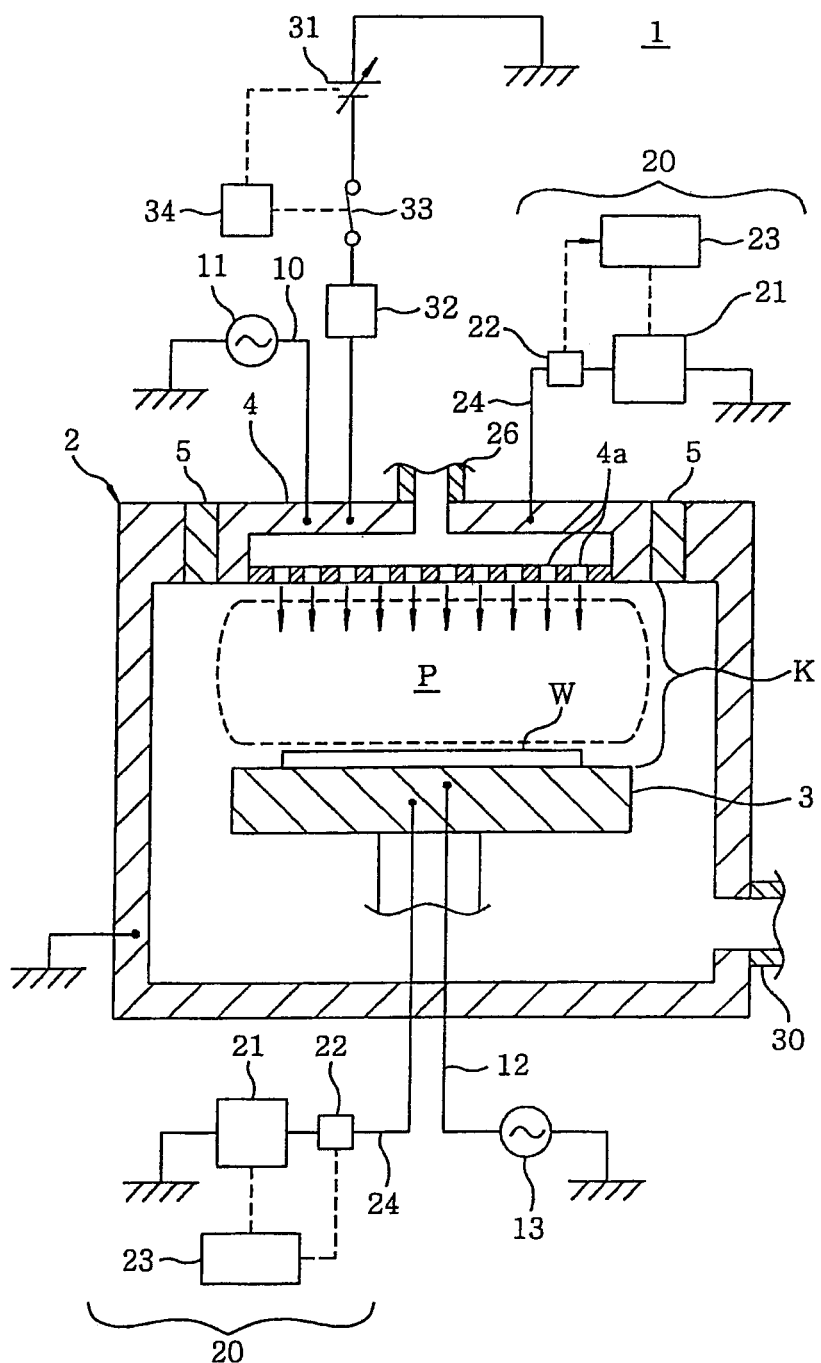
FIG. 13 provides a longitudinal cross sectional view to describe a configuration of a plasma etching apparatus in which radio frequency power supplies are connected to an upper and a lower electrode, respectively and, also, a DC power supply is connected to the upper electrode.

Also, as illustrated in FIG. 13, the variable DC power supply 31, the low pass filter 32 and the relay switch 33 can be installed at the upper electrode 4 in the plasma etching apparatus 1 for supplying radio frequency powers to both of the upper electrode 4 and the lower electrode 3 as shown in FIG. 8.

Figure 14:
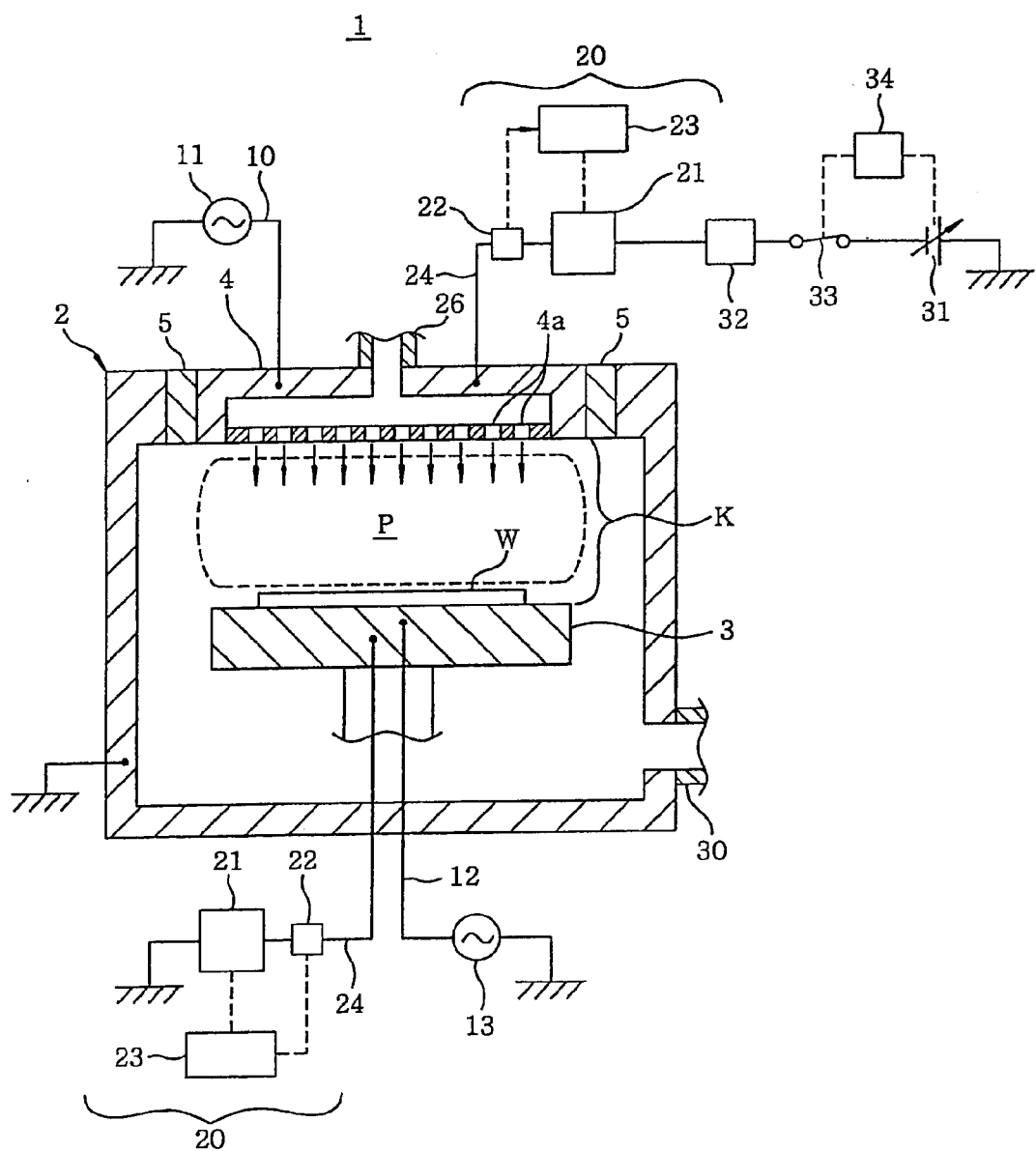
FIG. 14 sets forth a longitudinal cross sectional view to illustrate a configuration of a plasma etching apparatus in which radio frequency power supplies are connected to an upper and a lower electrode, respectively, and a DC power supply is installed on the GND side of an electrical characteristic control circuit.

Further, as depicted in FIG. 14, the above effect can be obtained by installing the variable DC power supply 31, the low pass filter 32 and the relay switch 33 on the GND side of the electrical characteristic control circuit 21 in the plasma etching apparatus 1 for supplying radio frequency powers to both of the upper and the lower electrode 4 and 3. Also, the above-mentioned DC voltage can be applied to the lower electrode 3 instead of the upper electrode 4 or to both of the upper and the lower electrode 4 and 3.

Figure 15:
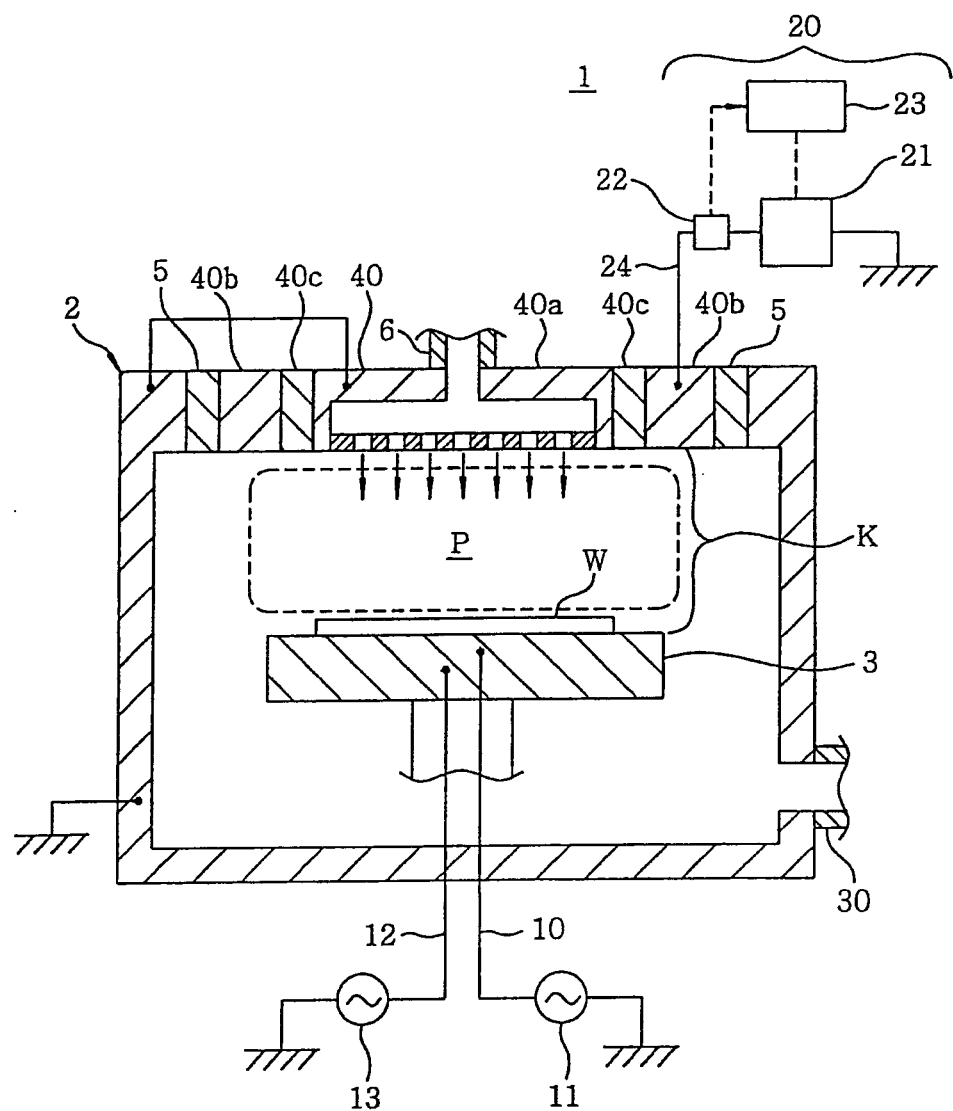
FIG. 15 offers a cross sectional view to describe a configuration of a plasma etching apparatus having an upper electrode that is divided into electrode portions.

Though the upper electrode 4 of the plasma etching apparatus 1 has a disc-shaped single body structure in the above-described preferred embodiment, as shown in FIG. 15, it can be divided into a plurality of electrode portions, and one of the electrode portions can be configured to have the electrical characteristic control unit 20. An upper electrode 40 is divided into an inner electrode portion 40a and an outer annular electrode portion 40b disposed to surround the inner electrode 40a. An annular insulator 40c is interposed between the inner and the outer electrode portion 40a and 40b. The inner electrode portion 40a is grounded, and the outer electrode portion 40b is connected to, e.g., an electrical characteristic control circuit 21 via a conductive line 24. The other configuration of the apparatus is identical to that of the plasma etching apparatus 1 in the above-described preferred embodiment.

Further, during an etching process, an impedance of a circuit at the side of the outer electrode portion 40b to the plasma P is adjusted by the electrical characteristic control circuit 21 such that the circuit does not resonate. In this case, an in-surface uniformity of the etching is improved at, e.g., the wafer W's peripheral portion facing the outer electrode portion 40b. Additionally, in this example, it is possible to install another electrical characteristic control unit 20 at the inner electrode portion 40a, to thereby adjust impedances of circuits at the sides of the outer electrode portion 40b and the inner electrode portion 40a individually. By doing this, an etching characteristic in each region of the wafer W can be improved individually. Further, it is also possible to install the electric characteristic control unit 20 at the inner electrode portion 40a instead of the outer electrode portion 40b.

Figure 16:
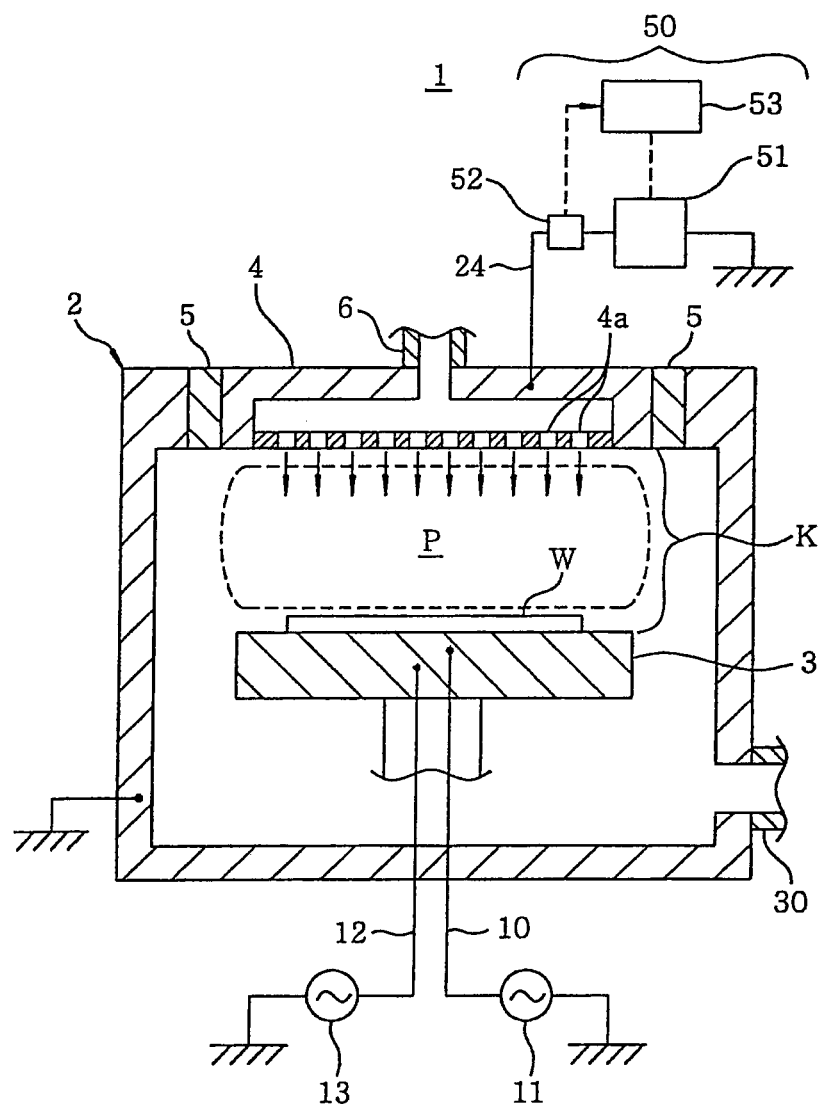
FIG. 16 exhibits a longitudinal cross sectional view to illustrate a configuration of a plasma etching apparatus for adjusting current flowing into an upper electrode.

In the above-described preferred embodiment, an impedance of a circuit at the side of a facing electrode which faces a power supply electrode to a plasma P is adjusted to prevent the circuit from resonating. But, in a different aspect, it is also possible to adjust an electrical characteristic of the facing electrode side to the plasma P such that a value of current flowing into the facing electrode from the processing space K does not reach its maximum value. In this case, as illustrated in FIG. 16, an electrical characteristic control unit 50 is installed at the side of an upper electrode 4 serving as the facing electrode in a plasma etching apparatus 1. The electrical characteristic control unit 50 includes, for example, an electrical characteristic control circuit 51, a current value detector 52, a controller 53 and the like.

The electrical characteristic control circuit 51 is connected to the upper electrode 4 via a conductive line 24, and has a variable condenser 25 and a fixed coil 26 as in the electrical characteristic control circuit 21 described in the preferred embodiment of the present invention. The value of current flowing into the upper electrode 4 can be adjusted by varying the capacitance of the variable condenser 25. The current value detector 52 is coupled to, e.g., the conductive line 24 to detect a value of current B flowing into the upper electrode 4 and output a detection result to the controller 53. A maximum current value for the current B obtained in advance is stored in the controller 53. The controller 53 controls the variable condenser 25 of the electrical characteristic control circuit 51 based on the detection result from the current value detector 52 such that the value of the current B flowing into the upper electrode 4 does not reach the maximum current value. Further, the other configuration of the plasma etching apparatus 1 in this example is identical to that described in the above preferred embodiment, and description thereof will be omitted.

Further, during the etching process, the value of the current B flowing into the upper electrode 4 is detected by the current value detector 52 on a real time basis. The controller 53 controls the variable condenser 25 based on the detection result of the current value detector 52 such that the value of the current B does not reach the maximum current value. As described above, when the current B is adjusted not to reach the maximum current value, the circuit at the side of the upper electrode 4 does not resonate, so that the in-surface uniformity of etching process can be effectively improved as in the case of adjusting an impedance of the circuit to prevent the circuit from resonating in accordance with the above-described preferred embodiment. In particular, if the value of the current B is adjusted not to be smaller than ½ of the maximum current value flowing into the upper electrode 4 (i.e., ½ of the maximum current value≦the value of the current B<the maximum current value), the effect of improving an etching rate and reducing a damage caused by the etching can be obtained as in the above-described preferred embodiment wherein the impedance is set to deviate by a magnitude within 10Ω from the resonance point.

In this example, when a radio frequency power is applied to, e.g., the upper electrode 4, the electrical characteristic of the lower electrode 3 side to the plasma P is adjusted such that the value of the current B flowing into the lower electrode 3 does not reach its maximum current value. Besides, when radio frequency powers are applied to both of the upper and the lower electrode 4 and 3, the electrical characteristics of both electrodes are adjusted such that the values of current flowing into the upper and the lower electrode 4 and 3 do not reach their respective maximum current values.

Further, also in this case, it is possible to connect a variable DC power supply to at least one of the upper and the lower electrode 4 and 3, to thereby apply a DC voltage to at least one of them.

Moreover, as described in the above-described preferred embodiment, the upper electrode 4 can be divided into a plurality of electrode portions, and the electrical characteristic control unit 50 can be installed in at least one of them to adjust a value of current flowing into that electrode portion not to reach a maximum current value. For example, the electrical characteristic control unit 50 can be installed at the outer electrode portion 40b of the upper electrode 40 as shown in FIG. 10.

It is noted that the present invention is not limited to the preferred embodiment described above. For example, though the preferred embodiment has been described with respect to the plasma etching apparatus 1, the present invention can be applied to various other plasma processing apparatuses for wafer processing such as film forming process. Further, a substrate to be processed by the plasma processing apparatus of the present invention is not limited to a wafer but can be an organic EG substrate, a flat-panel display (FPD) substrate and the like.

The plasma processing apparatus for processing a substrate in accordance with the present invention has an advantage in improving a uniformity of the processing over the entire surface of the substrate.

In accordance with the present invention, it is possible to improve an in-surface uniformity in a plasma processing by reducing a discrepancy in the speed of the processing over the entire surface of a substrate.

While the invention has been shown and described with respect to the preferred embodiments, it will be understood by those skilled in the art that various changes and modifications may be made without departing from the spirit and scope of the invention as defined in the following claims.

The invention claimed is:

1. A plasma processing method, comprising the steps of:
mounting a substrate on a lower electrode disposed to face an upper electrode in a processing chamber;
supplying a first radio frequency power to the lower electrode to thereby generate a plasma between the lower and the upper electrode;
supplying a second radio frequency power to the lower electrode to attract ions of the plasma to the substrate, wherein a frequency of the second radio frequency power is lower than a frequency of the first radio frequency power; and
processing the substrate by using the plasma,
wherein an impedance of a first circuit at the side of the upper electrode seen from the plasma for the frequency of the first radio frequency power is adjusted by an electrical characteristic control unit such that the first circuit does not resonate and a reactance of a second circuit at the side of the upper electrode from a surface of the upper electrode facing the plasma is adjusted to have a negative value by the electrical characteristic control unit while processing the substrate by using the plasma to thereby improve an in-surface uniformity in plasma processing,
wherein the first circuit includes the upper electrode, the electrical characteristic control unit, and a sheath region formed between the upper electrode and the plasma, and the second circuit includes the upper electrode and the electrical characteristic control unit.

2. The plasma processing method of claim 1, wherein the impedance is adjusted to deviate by a magnitude within 10Ω from a resonance point.

3. The plasma processing method of claim 1, wherein a DC voltage is applied to the upper electrode.

4. The plasma processing method of claim 1, wherein the negative value is −50Ω or below.

5. The plasma processing method of claim 1, wherein the upper electrode is divided into a plurality of electrode portions, and the electrical characteristic control unit is installed in at least one of the plurality of electrode portions.

* * * * *